United States Patent
Lee

(12) United States Patent (10) Patent No.: US 6,967,865 B2
Lee (45) Date of Patent: Nov. 22, 2005

(54) LOW-CURRENT AND HIGH-SPEED PHASE-CHANGE MEMORY DEVICES AND METHODS OF DRIVING THE SAME

(75) Inventor: Se-ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/807,077

(22) Filed: Mar. 23, 2004

(65) Prior Publication Data

US 2004/0202017 A1 Oct. 14, 2004

(30) Foreign Application Priority Data

Apr. 4, 2003 (KR) .................................. 10-2003-0021419

(51) Int. Cl.[7] .............................................. G11C 11/00
(52) U.S. Cl. ...................... 365/163; 365/148; 365/113
(58) Field of Search ............................... 365/163, 148, 365/113

(56) References Cited

U.S. PATENT DOCUMENTS 6,570,784 B2 * 5/2003 Lowrey ...................... 365/163
6,816,404 B2 * 11/2004 Khouri et al. .............. 365/163
6,831,856 B2 * 12/2004 Pashmakov ................. 365/163
6,867,425 B2 * 3/2005 Wicker ......................... 257/3
6,885,602 B2 * 4/2005 Cho et al. ................... 365/211

* cited by examiner

Primary Examiner—Anh Phung
(74) Attorney, Agent, or Firm—Myers Bigel Sibley & Sajovec

(57) ABSTRACT

Phase-change memories in which phase is changed by varying the resistance by a small amount are provided. In the phase-change memory, a set state is defined as a state where amorphous nuclei are formed in a phase-change layer of a memory cell and the phase-change layer has an initial resistance that is higher than in a crystalline matrix, and a reset state is defined as a state where the number and/or the density of the amorphous nuclei are greater than those in the set state and a resistance is higher than in the set state. A current for writing the reset and set states is reduced to several hundred microamperes, and a period required for writing the reset and set states is reduced to several tens of nanoseconds to several hundred nanoseconds.

23 Claims, 9 Drawing Sheets

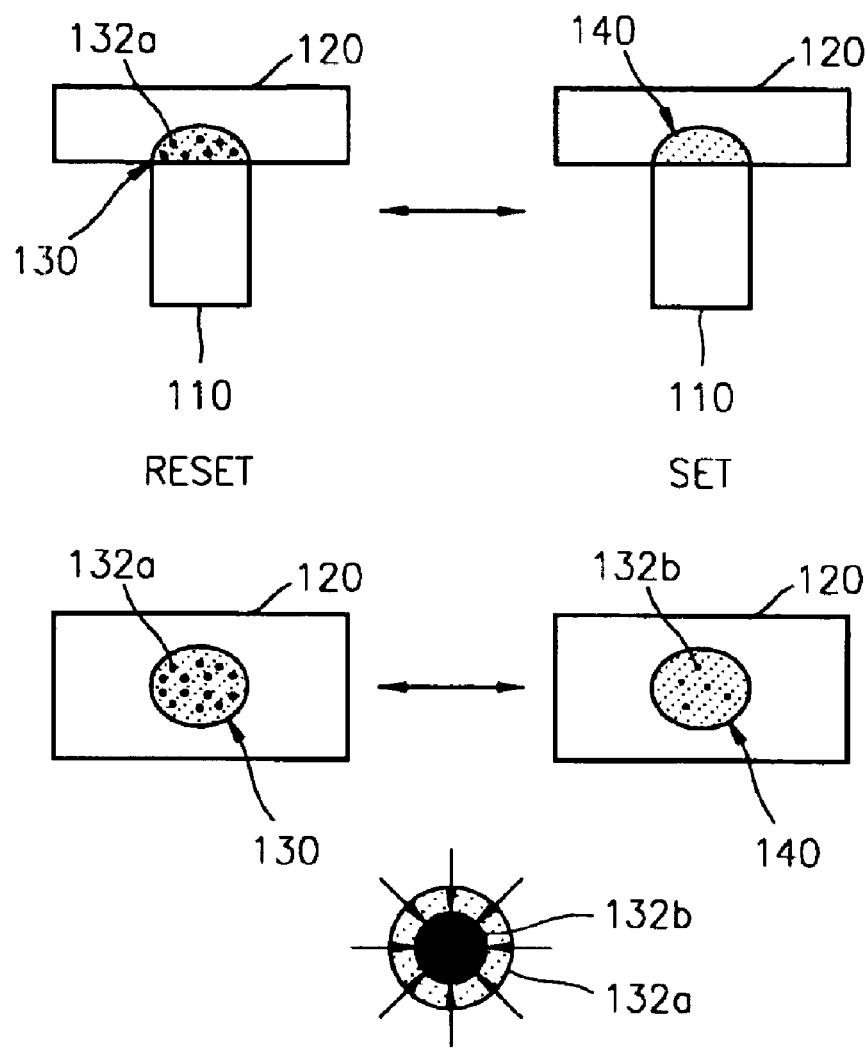

LOW-CURRENT AND HIGH-SPEED PHASE-CHANGE MEMORY DEVICES AND METHODS OF DRIVING THE SAME

CLAIM OF PRIORITY

This application claims priority from Korean Patent Application No. 2003-21419, filed on Apr. 4, 2003, in the Korean Intellectual Property Office, the contents of which are hereby incorporated by reference in their entirety as if set forth fully herein.

FIELD OF THE INVENTION

The present invention relates to phase-change memory using resistance variation generated by, for example, changing a chalcogenide material into an amorphous/crystalline state.

BACKGROUND OF THE INVENTION

A phase-change memory is a device that operates using a phase-change layer formed of a chalcogenide material, which has an electrical resistance that varies according to its phase. In the typical phase-change memory, Joule heating is used as a heating source to cause a change in phase. FIG. 1 shows a conventional phase-change memory cell array.

As shown in FIG. 1, a conventional phase-change memory cell typically includes a cell transistor CTR having a gate connected to a word line WL as well as a phase-change memory cell PCC and a resistor R that are connected in series between a drain of the cell transistor CTR and a bit line BL. If a word line WL and a bit line BL are selected, current is applied to a selected phase-change memory cell PCC corresponding to the selected word line WL and bit line BL to change the phase of the phase-change memory cell PCC.

FIG. 2A illustrates the principle of operation of the conventional phase-change memory. Referring to FIG. 2A, a high current pulse of about 2 mA to 3 mA is applied through a contact 10 to a phase-change layer 20 for several microseconds to heat the phase-change layer 20 to a melting temperature $T_m$. By rapidly cooling the phase-change layer 20 immediately after interrupting the current pulse, a high-resistance wholly amorphous programming region 30 is formed at a contact portion between the phase-change layer 20 and the contact 10. In this case, the phase-change memory cell is in a "reset" state, which is defined as, for example, storage of data "1."

If a current pulse of about 1 mA to 2 mA is passed through the contact 10 to the phase-change layer 20 for several microseconds and then immediately cooled again, the wholly amorphous programming region 30 crystallizes and the resistance of the phase-change layer 20 decreases again. In this case, the phase-change memory cell is in a "set" state, which is defined as, for example, storage of data "0."

FIG. 2B is a graph of resistance versus current for the phase-change memory cell of FIG. 2A. That is, current applied to the phase-change layer 20 is increased to about 0.4 mA to about 0.38 mA, and a variation in the resistance of the phase-change layer is measured. Referring to FIG. 2B, curve (a) represents the situation where the phase-change memory cell was initially in the reset state with a reset resistance $R_{reset}$ of about 300 kΩ. When the current reached 1 mA to 2 mA, the resistance markedly reduced to about 3 kΩ. Accordingly, the phase-change memory cell transited from the reset state to the set state in the current range of 1 mA to 2 mA. Thus, a set resistance $R_{set}$ is about 3 kΩ and a set current $I_{set}$, which makes the transition to the set state, is about 1 mA to 2 mA. Curve (b) represents the case where the phase-change memory cell was initially in the set state with the set resistance $R_{set}$. The resistance increases to about 300 kΩ when the current increased from about 2 mA to 3 mA. Accordingly, the phase-change memory cell transited from the set state to the reset state. $I_{reset}$ is about 2 mA to 3 mA.

To read stored data, a current, which is less than the current $I_{reset}$ and $I_{set}$, is supplied or a voltage is applied to the phase-change memory cell and then a variation in resistance is detected. As shown in FIG. 2B, a switching ratio of the reset resistance to the set resistance may be 100 or more. In the conventional phase-change memory, application of a high current $I_{reset}$ or $I_{set}$ of several milliamperes is required for the transition to a wholly amorphous state or a crystalline state, respectively, and data can be read or stored using the larger variation in the resistance resulting from the phase transition. In this case, the current required may be large enough to cause overheating in a cell transistor which may be a serious obstacle in producing highly integrated memory devices.

Also, for the conventional phase-change memory, it typically takes a period of about several microseconds to transit to the reset or set state, thereby slowing down the operating speed of the phase-change memory.

SUMMARY OF THE INVENTION

Embodiments of the present invention provide for establishing a state of a phase-change memory by writing a reset state as a high-resistance state by applying a reset current of about ten microamperes to several hundred microamperes to a phase-change layer of a phase-change memory cell for a period of from about 10 nanoseconds to about 100 nanoseconds and writing a set state as a low-resistance state by applying a set current of about several tens of microamperes to the phase-change layer for a period of from about 10 nanoseconds to about 100 nanoseconds. In certain embodiments of the present invention, the set current is from about 30 microamperes to about 50 microamperes, and the reset current is from about 60 microamperes to about 200 microamperes. A reset resistance of the phase-change layer may be from about 6 kΩ to about 20 kΩ. A ratio of reset resistance to set resistance may be from about 1.5 to about 3.

In further embodiments of the present invention, each of a rising time and a falling time of the reset current or the set current is from about 1 nanosecond to about 4 nanoseconds. The current applied to the phase-change layer for reading the reset and/or the set states may be from about 3 μA to about 6 μA and the time required for reading the reset and/or the set states may be from about 5 nanoseconds to about 10 nanoseconds.

In additional embodiments of the present invention, a phase-change memory, is driven by writing a set state by applying a set current of from about 30 μA to about 50 μA to a crystalline phase-change layer of a memory cell and writing a reset state by applying a reset current of from about 60 μA to about 200 μA to the phase-change layer. The reset state is defined as a state where a resistance of the phase-change layer is greater than in the set. A ratio of reset resistance to set resistance of the phase-change layer may be from about 1.5 to about 3. The current for reading the reset state and/or the set state may be from about 3 μA to about 6 μA, and a period required for reading the reset state and/or the set state may be from about 5 nanoseconds to about 10 nanoseconds. A time required for writing the reset state and/or the set state may be from about 10 nanoseconds to about 100 nanoseconds. A reset resistance of the phase-change layer may be from about 6 kΩ to about 20 kΩ and a set resistance of the phase-change layer may be from about 4 kΩ to about 6 kΩ.

In yet other embodiments of the present invention, a phase-change memory includes a first electrode contact, a phase-change layer on the first electrode contact and a second electrode contact on the phase-change layer. A set state is a state in which amorphous nuclei are formed in the phase-change layer that has a set resistance of from about 4 kΩ to 6 kΩ, and a reset state is a state in which the number and density of the amorphous nuclei are greater than in the set state and has a reset resistance of about 6 kΩ to 20 kΩ. The current for writing the reset state and/or the set state on the phase-change layer may be from about 10 μA to about 200 μA, and a period required for writing the reset state and/or the set state from the phase-change layer may be from about 10 nanoseconds to about 100 nanoseconds. In particular embodiments, the current for writing the set state in the phase-change layer may be from about 30 μA to about 50 μA, and the current for writing the reset state in the phase-change layer is from about 60 μA to about 200 μA. The diameter of the first electrode contact to which the current is applied to write the reset and set states in the phase-change layer may be from about 40 nanometers to about 70 nanometers.

In particular embodiments of the present invention, the rising time and falling time for writing the reset state and/or the set state in the phase-change layer is from about 1 nanosecond to about 4 nanoseconds. The current for reading the reset state and/or the set state may be from about 3 μA to about 6 μA, and a time required for reading the reset state and/or the set state is from about 5 nanoseconds to about 10 nanoseconds.

In still further embodiments of the present invention, a phase-changeable memory device includes a phase change memory cell and a sense amplifier circuit configured to detect a change in resistance of the phase change memory cell from a first resistance associated with a first state of the phase change memory cell to a second resistance associated with a second state of the phase change memory cell, the second resistance being from about 1.5 to about 3 times the first resistance. For example, the first resistance may be from about 4 kΩ to about 6 kΩ and the second resistance may be from about 6 kΩ to about 20 kΩ.

The phase-changeable memory device may also include a set current source configured to provide a set write current of from about 30 μA to about 50 μA to the phase change memory cell. The set write current may be provided to the phase-change memory cell for from about 10 nanoseconds to about 100 nanoseconds. The phase-changeable memory device may also include a reset current source configured to provide a reset write current of from about 60 μA to about 200 μA to the phase change memory cell. The reset write current may be provided to the phase-change memory cell for from about 10 nanoseconds to about 100 nanoseconds.

In yet other embodiments of the present invention, a phase change memory includes first and second electrode contacts and a phase-change layer between the first and second electrode contacts. The phase change layer provides a first state established by a first number of amorphous nuclei in a crystalline matrix in a region adjacent an interface between the phase-change layer and the first electrode. The phase change layer may also provide a second state established by a second number of amorphous nuclei in a crystalline matrix in the region adjacent the interface between the phase-change layer and the first electrode, the second number being greater than the first number. The first number of amorphous nuclei and the second number of amorphous nuclei may provide a ratio of resistances of the phase-change layer of from about 1.5 to about 3. The first state of the phase-change layer may provide a resistance of the phase-change layer of from about 4 kΩ to about 6 kΩ and the second state the phase-change layer may provide a resistance of the phase-change layer of from about 6 kΩ to about 20 kΩ.

In particular embodiments of the present invention, the current for writing the first state or the second state on the phase-change layer is from about 10 μA to about 200 μA, and the period required for writing the first state or the second state from the phase-change layer is from about 10 nanoseconds to about 100 nanoseconds. For example, the current required for writing the first state in the phase-change layer may be from about 30 μA to about 50 μA, and the current required for writing the second state in the phase-change layer may be from about 60 μA to about 200 μA. The diameter of the first electrode contact to which a current is applied to write the first and second states in the phase-change layer may be from about 40 nanometers to about 70 nanometers. The current for reading the first state and/or the second state may be from about 3 μA to about 6 μA, and a time required for reading the first state and/or the second state may be from about 5 nanoseconds to about 10 nanoseconds.

BRIEF DESCRIPTION OF THE DRAWINGS

FIG. 3 is a diagram illustrating the reset and set principles of a phase-change memory according to some embodiments of the present invention;

DETAILED DESCRIPTION OF THE INVENTION

Figure 1:
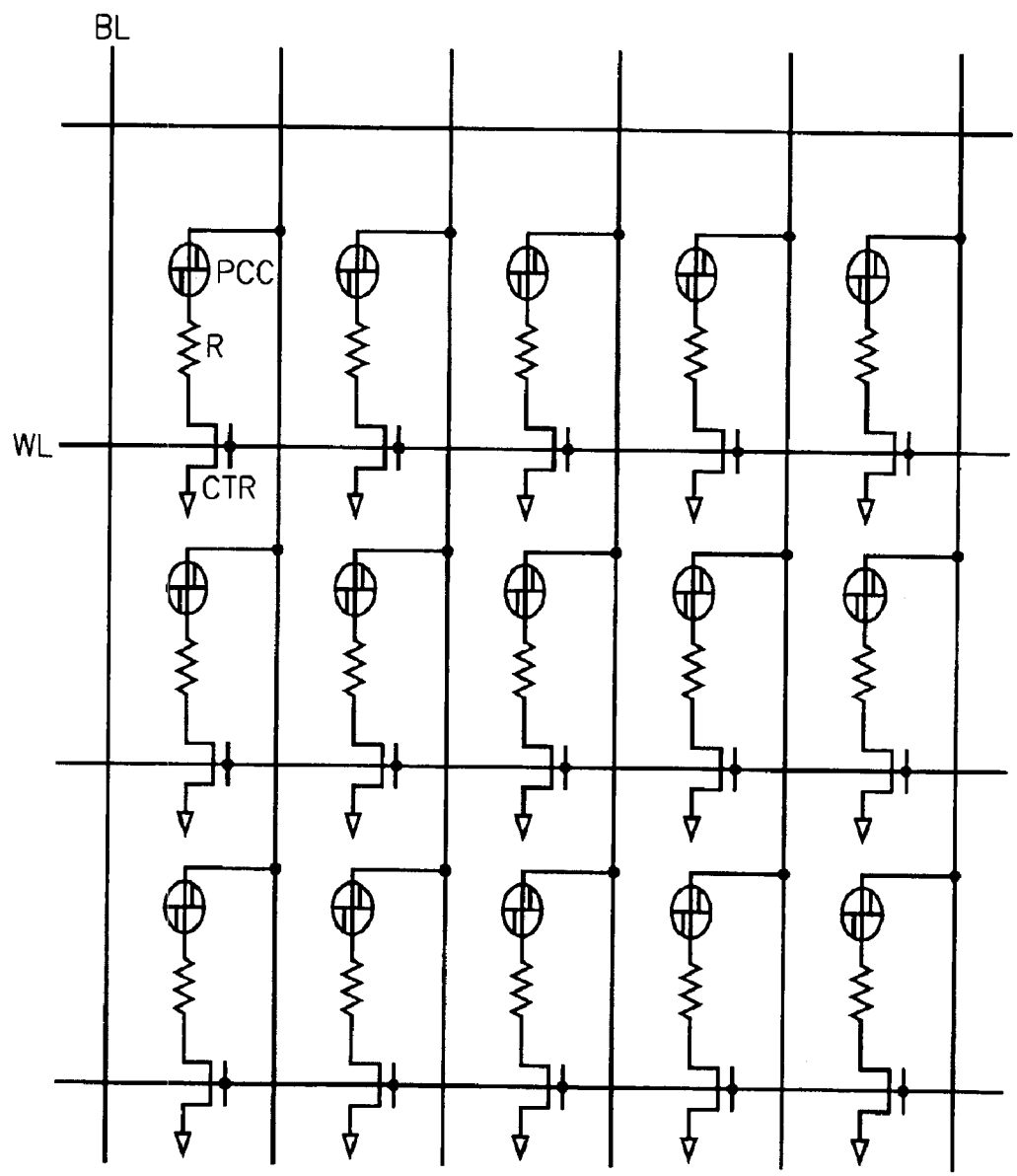
FIG. 1 is a diagram of a conventional phase-change memory cell array.

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. As used herein the term "and/or" includes any and all combinations of one or more of the associated listed items.

It will be understood that although the terms first and second may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second region, layer or section could be termed a first region, layer or section without departing from the teachings of the present invention.

Embodiments of the present invention are described herein with reference to a particular theory of operation. However, the present invention is not limited to a particular theory of operation, which is provided for purposes of clarity and not limitation.

FIG. 3 is a diagram illustrating the set/reset principles of a phase-change memory according to embodiments of the present invention. A low current pulse of several tens to several hundred microamperes, for example, from about 60 $\mu$A to about 200 $\mu$A, is supplied through a contact 110 to a crystalline phase-change layer 120 for a short amount of time, for example, from about 10 ns to about 100 ns, so as to locally heat the phase-change layer 120 to a melting temperature $T_m$. Then, by rapidly cooling the phase-change layer 120 immediately after the current pulse is interrupted, amorphous nuclei 132a are formed locally at a contact portion between the phase-change layer 120 and the contact 110, thereby forming a programming region 130, which has a resistance higher than an initial resistance $R_i$ of the crystalline phase-change layer 120. The phase-change memory cell is in a "reset" state, which may be defined as a storage of data "1." That is, the reset state in the phase-change memory of embodiments of the present invention differs from a wholly amorphous state in the conventional phase-change memory, because in the reset state of the phase-change memory of embodiments of the present invention, amorphous nuclei are distributed in a crystalline matrix. For a contact 110 with a predetermined diameter and initial resistance, the reset resistance $R_{reset}$ depends on a reset current $I_{reset}$ and period over which the reset current $I_{reset}$ is applied. For example, when the diameter of the contact 110 is about 60 nm and the initial resistance ranges from 4 k$\Omega$ to 6 k$\Omega$, then, if a current pulse in the range of several tens of microamperes to several hundred microamperes with a period of several tens of nanoseconds is supplied through the contact 110, the reset resistance $R_{reset}$ ranges from about 6 k$\Omega$ to 20 k$\Omega$.

If the phase-change layer 120 is held at a crystallization temperature for a relatively short amount of time of about 10 nanoseconds to 100 nanoseconds, in particular embodiments of the present invention, about 50 nanoseconds to about 100 nanoseconds, by applying a low current pulse of several tens of microamperes, in particular embodiments of the present invention, about 30 $\mu$A to about 50 $\mu$A, (i.e., a set current $I_{set}$) to the phase-change layer 120 and then cooled again, the amorphous nuclei 132a become smaller to form amorphous nuclei 132b, which are smaller and fewer in number than the amorphous nuclei 132a. Thus, a phase-change region 140 with a reduced density of the amorphous nuclei 132b is formed. The phase-change memory cell is in a "set" state, which is defined as a storage of data "0." As the density and number of high-resistance amorphous nuclei decrease, a set resistance $R_{set}$ is reduced to from about 4 k$\Omega$ to about 6 $\mu$A, which is lower than the reset resistance $R_{reset}$.

As described above, when the phase-change memory cell transits from the reset state to the set state, a low programming region 140 with the reduced number and/or density of amorphous nuclei is formed. It has been confirmed by experimental results that, although a ratio of the reset resistance $R_{reset}$ to the set resistance $R_{set}$ ranging from 1.5 to 3 is much less than a ratio of several hundred in the conventional memory, the set and reset resistance change can be sufficiently sensed. In certain embodiments of the present invention, to obtain the ratio of the reset resistance $R_{reset}$ to the set resistance $R_{set}$ ranging from about 1.5 to about 3, a set current $I_{set}$ of several tens of microamperes to several hundred microamperes is applied for a period of several tens of nanoseconds.

To read stored data, a current of less than the set and reset currents $I_{set}$ or $I_{reset}$, for example, a current of about 3 $\mu$A to 6 $\mu$A is supplied through the contact 110 and a resistance is measured, which is compared with the set and reset resistances $R_{set}$ and $R_{reset}$. The time required for determining the state of the phase-change memory cell ranges from about 5 nanoseconds to 10 nanoseconds.

In certain embodiments of the present invention, amorphous nuclei are formed using set and reset currents $I_{set}$ and $I_{reset}$ of several tens of microamperes, which are less than the set and reset currents used in the conventional phase-change memory and produces a ratio of the reset resistance $R_{reset}$ to the set resistance $R_{set}$ of about 1.5 to 3, through which the phase-change memory can perform data writing and data reading. Since the writing current and pulse duration are less than those in the conventional memory, a low-current and high-speed phase-change memory may be provided.

Figure 2A:
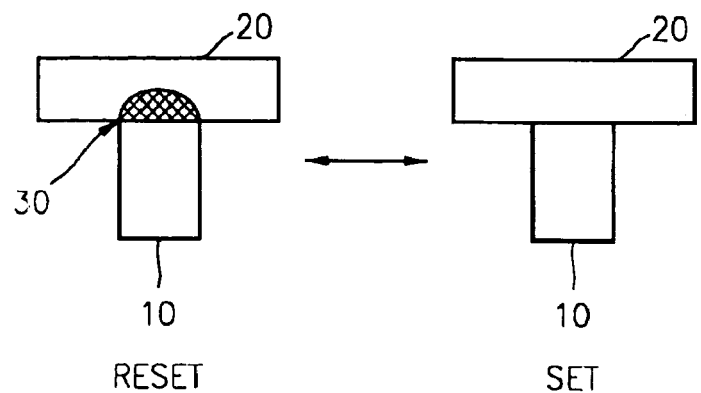
FIG. 2A is a diagram illustrating the reset and set principles of the conventional phase-change memory.
Figure 2B:
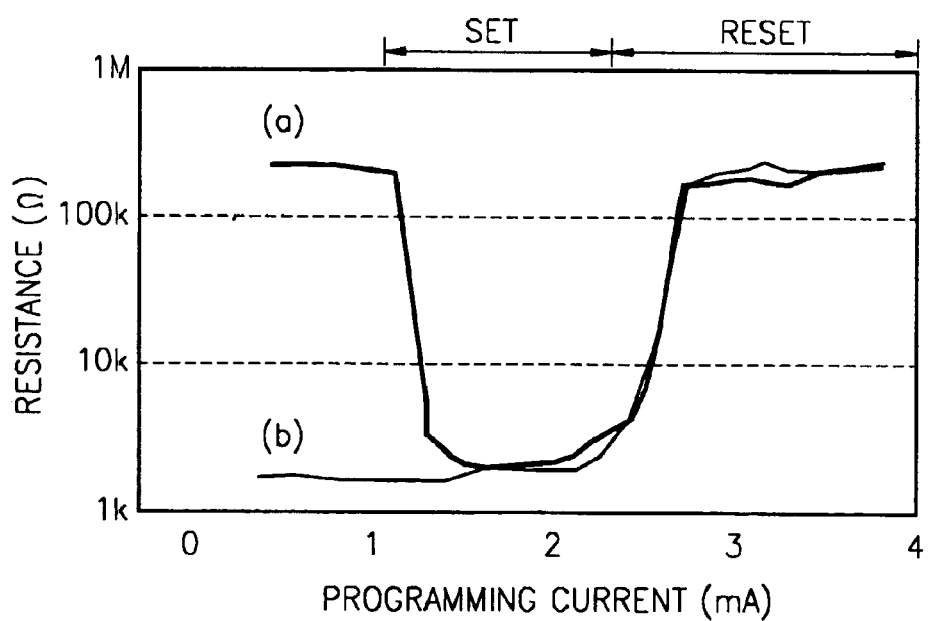
FIG. 2B is a graph of resistance versus programming current of the phase-change memory cell of FIG. 2A.
Figure 4A:
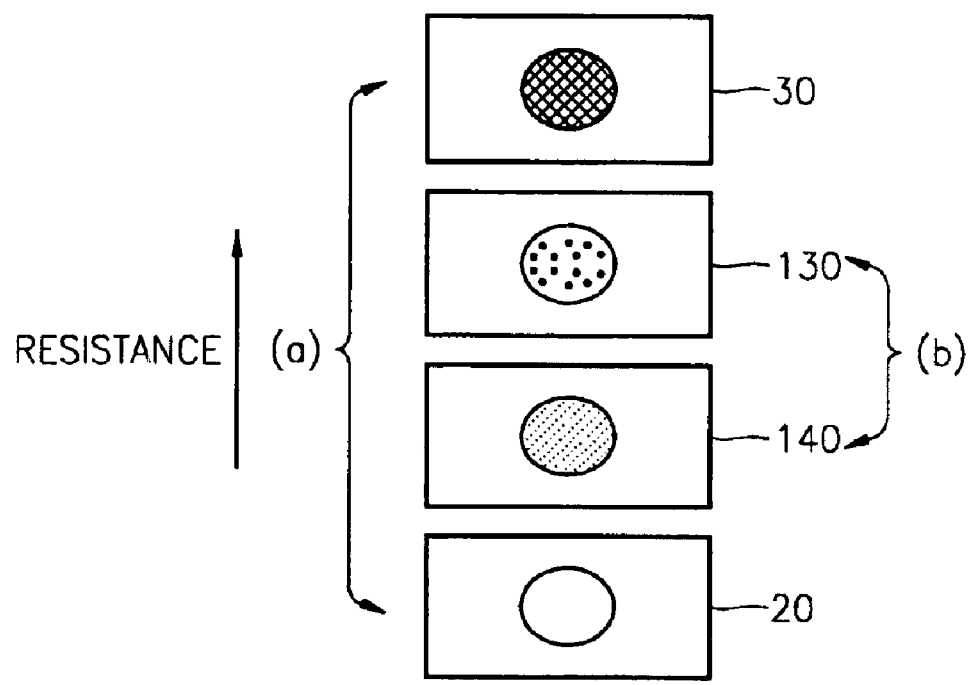
FIGS. 4A and 4B are diagrams showing comparisons between phase transitions of the phase-change memory of FIG. 2 and the phase-change memory of FIG. 3.
Figure 4B:
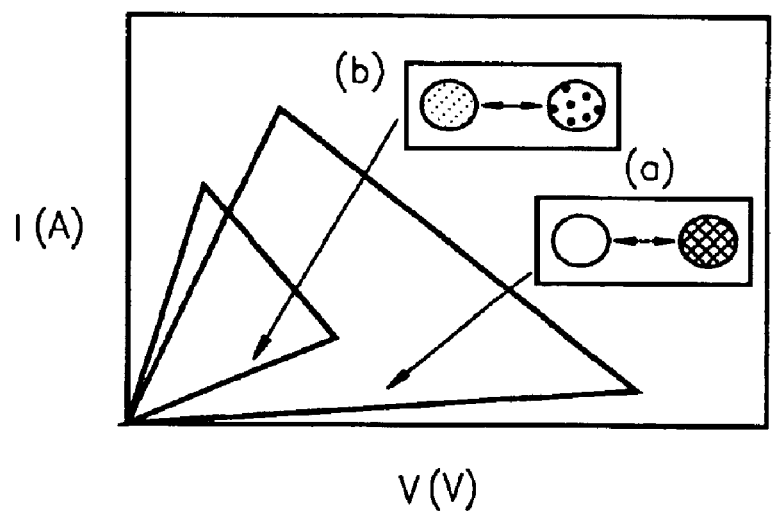

FIGS. 4A and 4B are diagrams showing comparisons between phase transitions of the phase-change memory of FIG. 2 and the phase-change memory of FIG. 3. Referring to FIG. 4A, a conventional phase-change memory (a) as described with reference to FIG. 2 provides a set and reset resistance by transiting from a wholly crystalline state 20 to a wholly amorphous state 30 and vice versa. Thus, there is a large variation in the resistance when changing states in the conventional phase-change memory cell. On the other hand, the phase-change memory (b) of embodiments of the present invention provides a set and reset resistance by transiting the state of the phase-changeable material from a first state with a first amount of amorphous nuclei in a crystalline matrix 130 to the state with fewer amorphous nuclei 140.

Accordingly, there is a relatively small variation in the resistance when changing states in the phase-change memory cell according to embodiments of the present invention compared with the conventional phase-change memory (a).

Referring to FIG. 4B, the conventional phase-change memory (a) covers far wider ranges of current I and voltage V than the phase-change memory (b). In the conventional phase-change memory (a), to form a wholly amorphous region, it typically takes a longer time to generate and grow amorphous nuclei in a liquid state. Likewise, to crystallize the wholly amorphous region, it typically takes more than about 100 nanoseconds to generate and grow crystalline nuclei in the amorphous region. However, in the phase-change memory (b) of embodiments of the present invention, while amorphous nuclei are formed in the reset state, the number and volume of the amorphous nuclei are reduced in the set state. Therefore, narrower ranges of current I and voltage V are used in the phase-change memory (b) of embodiments of the present invention than in the conventional phase-change memory. Forming a region where amorphous nuclei are distributed typically requires only low current and a short duration current pulse in order to generate amorphous nuclei in a liquid state. That is, nucleation dominates growth of nuclei in the contact portion. Also, since there exists a crystalline matrix in the region where the amorphous nuclei are distributed, when transiting from a reset state to a set state, the already existing crystalline matrix will grow without the need of nucleation. That is, the expansion of the crystalline matrix dominates nucleation of the crystalline matrix. Therefore, the region where the amorphous nuclei are distributed can be easily transformed to a region where the number and volume of the amorphous nuclei are reduced, even with a small current and over a short period of time. Thus, phase-change memories according to embodiments of the present invention may exhibit low-current and high-speed characteristics.

The following Table 1 shows the characteristics of the conventional phase-change memory and the phase-change memory of certain embodiments of the present invention.

includes a set state cell and a reset state cell. The phase-change memory further includes two current sources $I_{reset}$ and $I_{set}$ and a current sense amplifier S/A for detecting a difference in resistance between the two cells. A memory cell includes a single cell transistor CTR, in which a gate is connected to a word line WLi or WLj, a phase-change memory cell PCC and a resistor R, which are connected series with each other between a drain of the cell transistor CTR and a bit line BL.

Figure 5A:
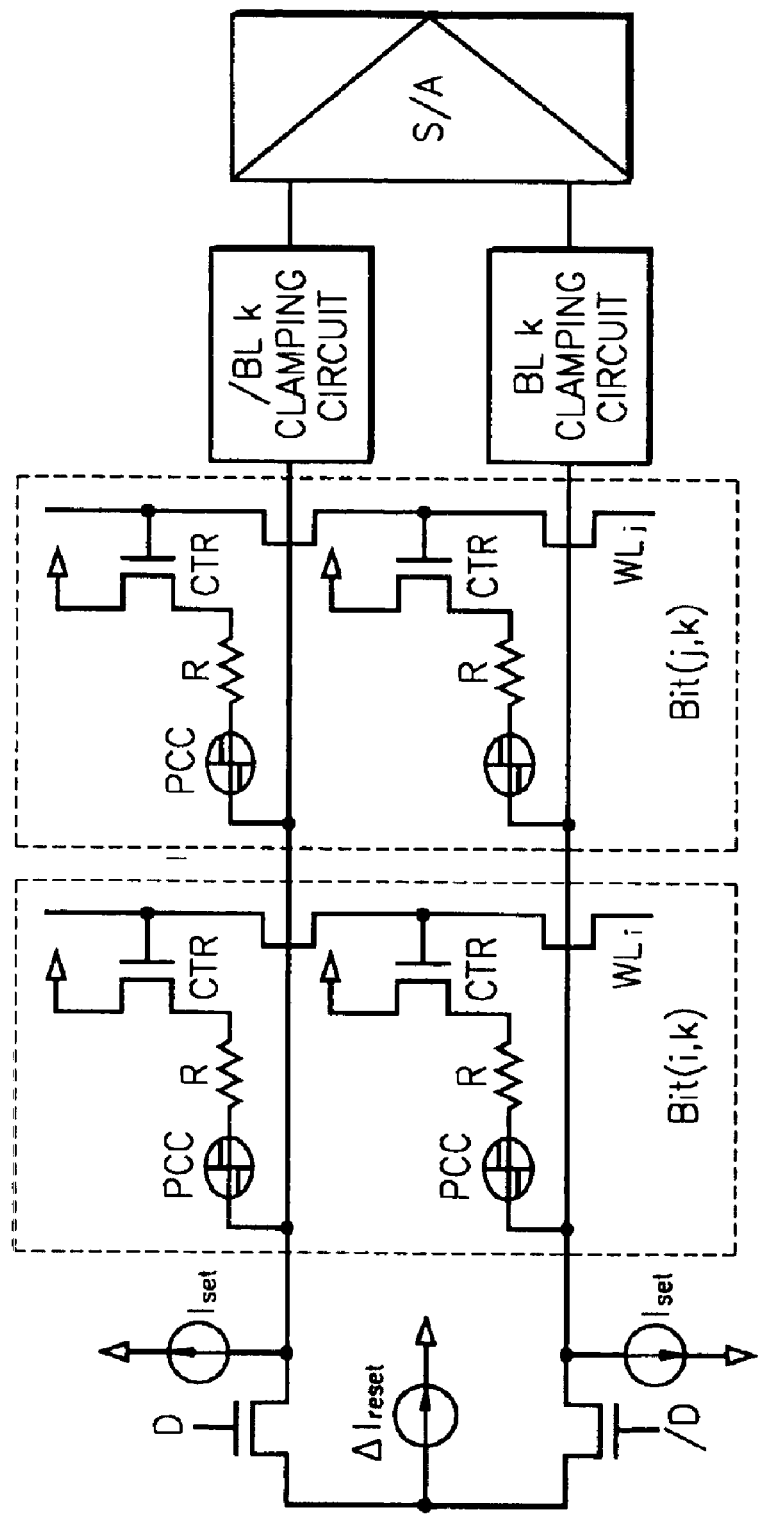
FIG. 5A is a circuit diagram of certain embodiments of the phase-change memory of FIG. 3.
Figure 5B:
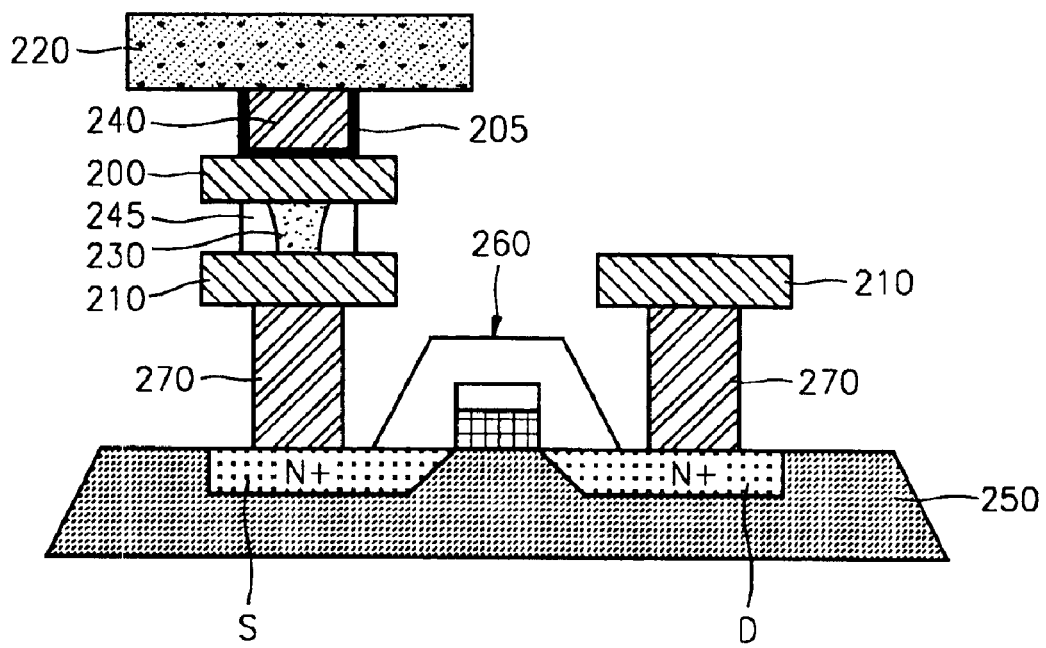
FIG. 5B is a sectional view of certain embodiments of the phase-change memory of FIG. 3.

Referring to FIG. 5B, a phase-change layer 200 is disposed between a first metal interconnection 210, which is connected to a source S of a MOS transistor 260 formed on a substrate 250 through a conductive plug 270, and a second metal interconnection 220, and is connected to the metal interconnections 210 and 220 through a lower electrode contact 230 and an upper electrode contact 240, respectively. The phase-change layer 200 may be formed of a binary compound such as GaSb, InSb, InSe, $Sb_2Te_2$, and/or GeTe, a ternary compound such as $Ge_2Sb_2Te_5$, InSbTe, GaSeTe, $SnSb_2Te_4$, and/or InSbGe, and/or a quaternary compound such as AgIbSbTe, (Ge, Sn)SbTe, and/or GeSb(SeTe).

Spacers 245 are formed to reduce a contact area between the phase-change layer 200 and the lower electrode contact 230. The lower electrode contact 230 may include a Ti/TiN plug, which is formed by depositing Ti/TiN in a lower electrode contact hole by chemical vapor deposition (CVD) and planarizing the Ti/TiN by chemical mechanical polishing (CMP). The thickness of the spacers 245 may be controlled such that a diameter of the contact is about 40 nanometers to about 70 nanometers, and in certain embodiments, about 60 nanometers. A Ti/TIN layer 205 may be formed on the phase-change layer 200 that is formed of, for example, $Ge_2Sb_2Te_5$, thereby reinforcing adhesion between the phase-change layer 200 and the upper electrode contact 240. The upper electrode contact 240 includes a W plug, which is formed by depositing W in an upper electrode contact hole by CVD and planarizing the W by CMP. A drain line is formed to include the first metal interconnection 210 connected to a drain D of the MOS transistor 260 through the conductive plug 270. The MOS transistor 260 can be

TABLE 1

Comparison of Phase Change Memory Characteristics

| | Set | Reset | Condition of set | Condition of reset | $R_{reset}/R_{set}$ |
|---|---|---|---|---|---|
| Conventional memory | Wholly crystalline state | Wholly amorphous state | 2 to 3 milliamperes or higher for several microseconds | 1 to 2 milliamperes for several microseconds | 100 or higher |
| The present invention | State where amorphous nuclei are formed | Number and size of amorphous nuclei are larger than in set state | several tens to several hundred microamperes for 10 to 100 nanoseconds | several tens of microamperes for 10 to 100 nanoseconds | 1.5 to 3 |

FIG. 5A is a circuit diagram of the phase-change memory according to certain embodiments of the present invention, and FIG. 5B is a sectional view of the phase-change memory according to certain embodiments of the present invention, which can be manufactured by a 0.24-μm CMOS process.

Referring to FIG. 5A, phase-change memory according to certain embodiments of the present invention operates by a twin-cell switching method excluding a reference cell and formed by the 0.24-μm CMOS process. For example, a 35 Å thick gate insulating layer can be formed so that a current of 2 milliamperes or more can be applied at a gate voltage of 3 V. Also, a silicide process may be further performed on the source S/drain D in order to reduce the series resistance between the source S/the drain D and the conductive plug 270. As a result, the series resistance may be less than about 10 Ω.

A current flows from the lower electrode contact 230 through the phase change layer 200 to the upper electrode contact 240. A change in phase occurs at an interface between the phase-change layer 200 and the lower electrode contact 230 due to Joule heating and rapid cooling resulting from the interruption of the current.

The invention will now be described in more detail in the following non-limiting examples.

The invention will now be described in more detail in the following non-limiting examples. In particular, the suitability of the phase-change memory of the present invention for an actual device was demonstrated through reset/set transition, resistance ratio, and a change in I–V curve.

EXAMPLE 1

Figure 6A:
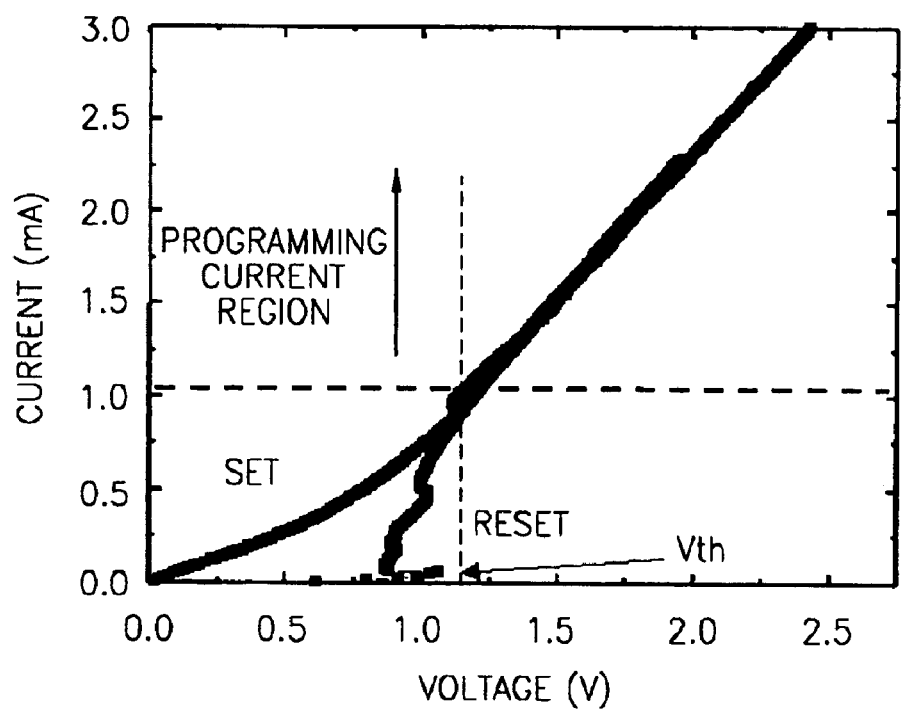
FIG. 6A is a graph illustrating I–V characteristics of the conventional phase-change memory after being in the reset state.

FIG. 6A is a graph illustrating I–V characteristics of the conventional phase-change memory after being in the reset state. When a voltage greater than a threshold voltage $V_{th}$ was applied to the device in the reset state ("1" state), the device was electronically switched to a low-resistance dynamic state, thereby allowing low-voltage programming. The threshold voltage $V_{th}$ was 1.0 V or higher and a programming current for writing set/reset was 1.0 milliampere or higher.

Figure 6B:
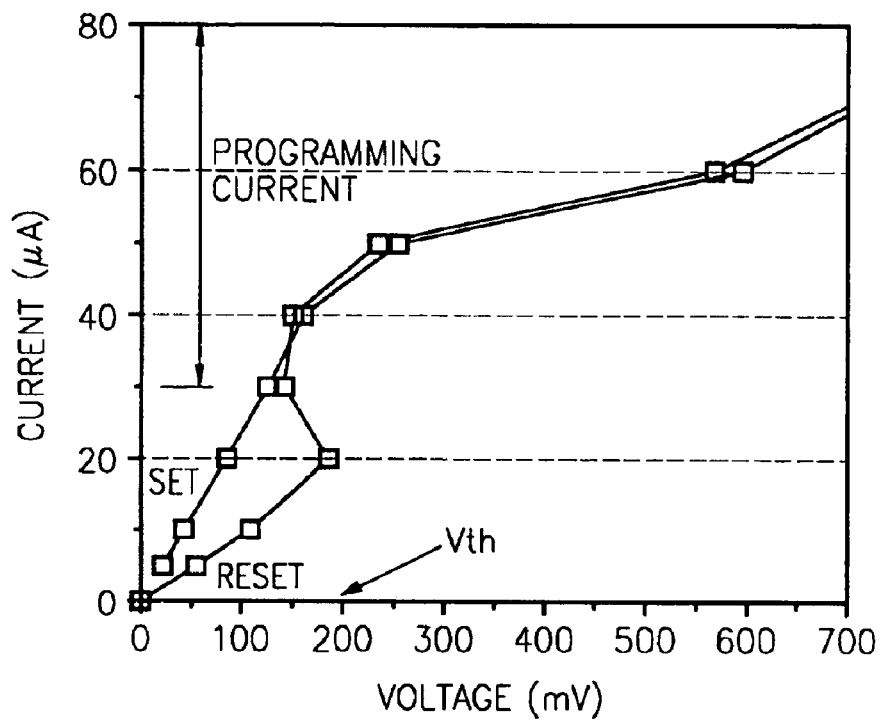
FIG. 6B is a graph illustrating I–V characteristics of the phase-change memory according to embodiments of the present invention after being in the reset state.

FIG. 6B is a graph illustrating I–V characteristics of the phase-change memory according to certain embodiments of the present invention after being in the reset state as a result of the application of a current pulse of 100 μA with a period of 50 nanoseconds. The threshold voltage $V_{th}$, was 200 mV, which is lower than in the conventional memory due to locally small amorphous nucleation. Also, a programming current for writing set/reset was markedly reduced to about 40 μA, which is less than in the conventional memory.

EXAMPLE 2

Figure 7:
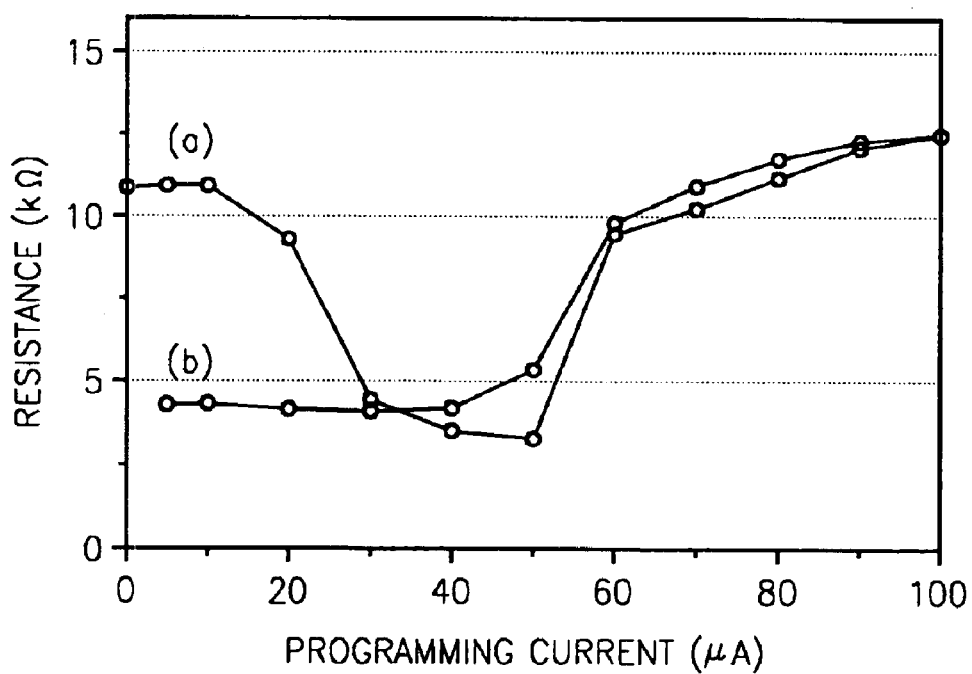
FIG. 7 is a graph of the resistance of a phase-change layer with respect to the programming current in the phase-change memory according to embodiments of the present invention.

The ranges of the reset and set currents $I_{reset}$ and $I_{set}$ can be determined by varying the resistance of the phase-change layer 120 by increasing the current. FIG. 7 is a graph of the resistance of the phase-change layer 120 with respect to the programming current in the phase-change memory according to certain embodiments of the present invention.

Initially, (a) started from the reset state (where an initial resistance was about 10.86 kΩ) by applying a current of 100 μA for a period of about 50 nanoseconds. In the current range of 30 μA to 50 μA, the resistance markedly decreased to 4 kΩ or lower. Thus, the phase-change memory cell transited from the reset state to the set state in the current range of 30 μA to 50 μA. That is, the set current $I_{set}$ can be selected in the range of 30 μA to 50 μA.

Also, (b) represents a phase-change memory cell which was initially in the set state (where the resistance was slightly higher than 4 kΩ). As the current increased above 60 μA, the resistance increased. When the current reached about 100 μA, the resistance was saturated. Accordingly, the phase-change memory cell transited from the set state to the reset state when the current was about 60 μA or higher, and a stable reset current $I_{reset}$ of about 100 μA can be selected.

EXAMPLE 3

Figure 8:
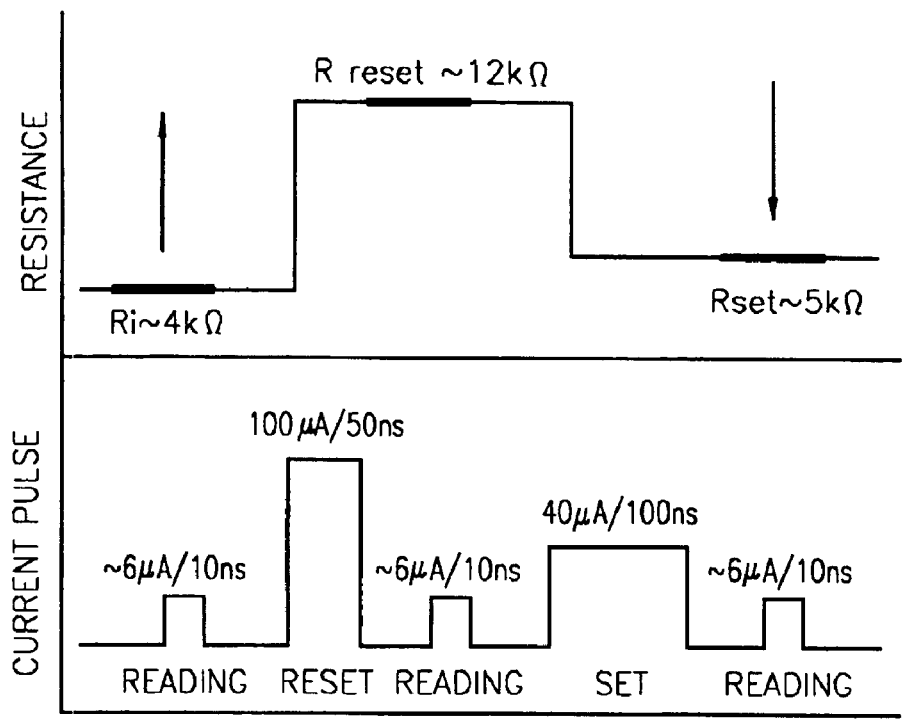
FIG. 8 is a diagram showing applications of current pulses for reading, reset, and set in the phase-change memory according to embodiments of the present invention.

FIG. 8 is a diagram showing applications of current pulses for reading, reset, and set in the phase-change memory according to certain embodiments of the present invention. Current $I_{reading}$ for reading the writing state of the phase-change memory cell can be taken within a range that does not affect $R_{reset}$ and $R_{set}$. Also, a rising time and falling time should be considered when applying the reading current $I_{reading}$ and interrupting the current. It can be expected that a rising time and a falling time typically range from 1 nanoseconds to 4 nanoseconds each.

An experiment was performed in which the rising time and falling time for set were 4 nanoseconds each and the rising time and falling time for reset and read were 2 nanoseconds each. A writing current and a pulse width were applied in the range of 100 μA/100 nanoseconds for reset/set. Specifically, 100 μA/50 nanoseconds was applied for reset and 40 μA/100 nanoseconds was applied for set. A reading current and a pulse width were applied in the range of 6 μA/10 nanoseconds in order to minimize effects during reading.

When reading, reset, and set were repeated under the above conditions, the initial resistance was 4 kΩ, $R_{reset}$ was 12 kΩ, and $R_{set}$ was 5 kΩ. Thus, the phase-change memory of certain embodiments of the present invention allows writing and reading under the above conditions.

EXAMPLE 4

Figure 9:
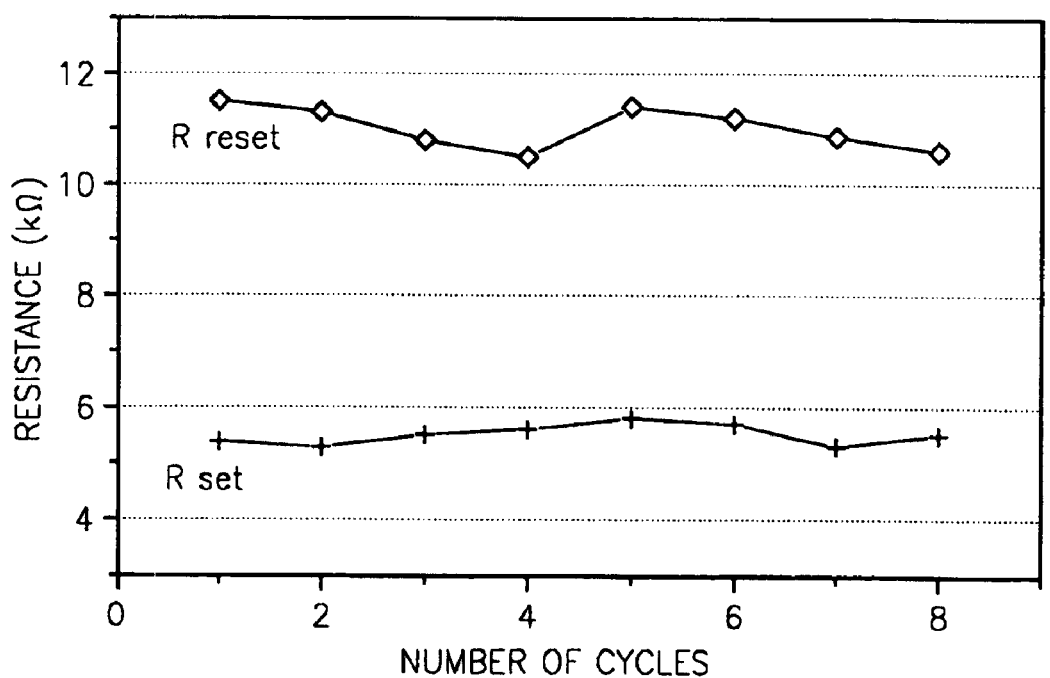
FIG. 9 is a graph showing the resistance of the phase-change layer after repetition of reset and set in the phase-change memory according to embodiments of the present invention.

FIG. 9 is a graph showing the resistance of the phase-change layer 120 after repetition of reset and set in the phase-change memory according to the present invention. That is, the phase-change memory cell was repeatedly reset, i.e., data "1" was repeatedly written and read, and the phase-change memory cell was repeatedly set, i.e., data "0" was repeatedly written and read. The reset was under conditions of 100 μA/50 nanoseconds, the set was under conditions of 40 μA/100 nanoseconds, and the reading was performed under conditions of 6 μA/10 nanoseconds. From the results, it can be seen that the reset and set resistances $R_{reset}$ and $R_{set}$ remained substantially constant, which is a requirement for the proper functions of a memory.

EXAMPLE 5

Figure 10:
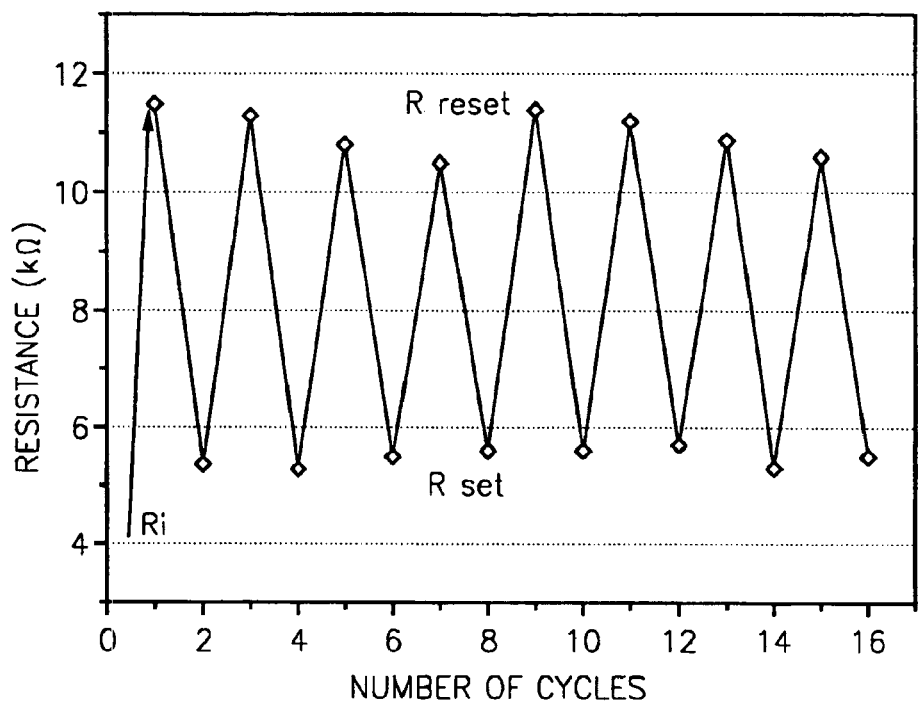
FIG. 10 is a graph showing the resistance of the phase-change layer after alternate repetition of reset and set in the phase-change memory according to embodiments of the present invention.

FIG. 10 is a graph showing the resistance of the phase-change layer 120 after alternate repetition of reset and set in the phase-change memory according to certain embodiments of the present invention. From the results, it can be seen that a ratio of the reset resistance $R_{reset}$ to the set resistance $R_{set}$ was substantially constant.

EXAMPLE 6

Figure 11:
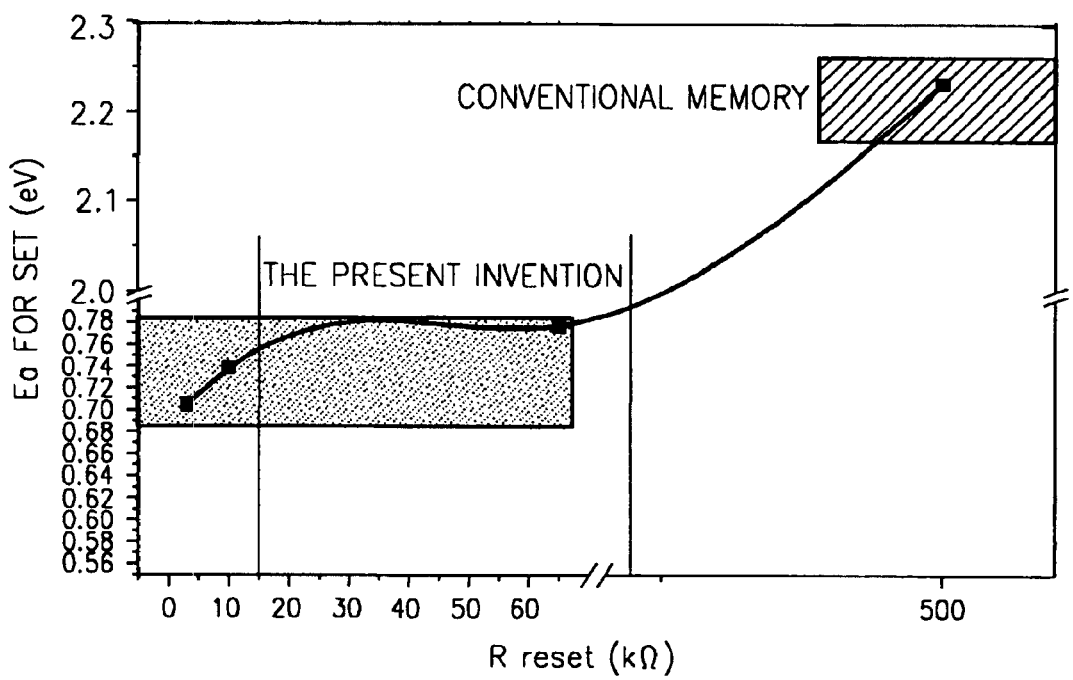
FIG. 11 is a graph that compares the activation energies $E_a$ for the set state of the conventional phase-change memory and the phase-change memory according to embodiments of the present invention.

FIG. 11 is a graph that compares the activation energies $E_a$ for the set state of the conventional phase-change memory and the phase-change memory according to certain embodiments of the present invention, which provides different driving methods of the phase-change memory. For the set operation, while an activation energy $E_a$ of about 2.25 eV was required in the conventional memory, activation energies $E_a$ of about 0.70 eV, 0.74 eV, and 0.78 eV were required in the embodiments of present invention illustrated in FIG. 11.

A conventional set operation defines reset as a high-resistance state. Thus, transition from the reset state to the set state, i.e., a crystalline state needs a high activation energy for nucleation and growth of crystalline nuclei. However, a set operation of certain embodiments of the present invention defines reset as a relatively low-resistance state. Thus, the transition from the reset state to the set state only requires the growth of a crystalline matrix including amorphous nuclei, and the activation energy is much lower than in the conventional memory.

The phase-change memory according to certain embodiments of the present invention may be characterized by particular physical and/or performance characteristics. In particular, when the diameter of a contact portion between a phase-change layer and a lower electrode contact ranges within several tens of nanometers, the phase-change memory exhibits suitable characteristics with respect to initial resistance range and/or dynamic resistance range. A reset resistance ranges from 6 kΩ to 20 kΩ, and a set resistance ranges from 4 kΩ to 6 kΩ. Thus, data sensing is enabled in a ratio of reset resistance to set resistance ranging from about 1.5 to about 3.

According to embodiments of the present invention, the phase of a crystalline phase-change layer can be changed by programming in a region where resistance varies within a very small range, and set and reset states are defined based on this phase-change method. Thus, the current required for reset can be reduced to several microamperes to several hundred microamperes, and with a reduced volume of amorphous nuclei, the time required to transit to the set state by crystallization is shortened. Also, the current required to transit to the set state is reduced to several microamperes to several hundred microamperes. Therefore, the phase-change memory of certain embodiments of the present invention can have high-speed and low-current characteristics, thereby allowing formation of highly integrated devices.

While embodiments of the present invention have been described primarily with reference to two states where each state includes amorphous nuclei in a crystalline matrix, embodiments of the present invention should not be limited to such devices. Thus, for example, embodiments of the present invention may include devices where one state is wholly crystalline or wholly amorphous in the region of the contact. Also, more that two states may be provided having amorphous nuclei in a crystalline matrix. The number of such states may only be limited by the ability to control the transition of the phase-changeable material and the ability to sense resulting changes in resistance.

While the present invention has been particularly shown and described with reference to particular embodiments thereof, it will be understood by those of ordinary skill in the art that various changes in form and details may be made therein without departing from the spirit and scope of the present invention as defined by the following claims.

What is claimed is:

1. A phase-change memory comprising:
   a first electrode contact;
   a phase-change layer on the first electrode contact; and
   a second electrode contact on the phase-change layer, wherein a set state is a state in which amorphous nuclei are formed in the phase-change layer that has a set resistance of from about 4 kΩ to 6 kΩ, and a reset state is a state in which the number and density of the amorphous nuclei are greater than in the set state and has a reset resistance of about 6 kΩ to 20 kΩ.

2. The phase-change memory of claim 1, wherein a current for writing the reset state and/or the set state on the phase-change layer is from about 10 μA to about 200 μA, and a period required for writing the reset state and/or the set state from the phase-change layer is from about 10 nanoseconds to about 100 nanoseconds.

3. The phase-change memory of claim 1, wherein a current for writing the set state in the phase-change layer is from about 30 μA to about 50 μA, and a current for writing the reset state in the phase-change layer is from about 60 μA to about 200 μA.

4. The phase-change memory of claim 1, wherein a diameter of the first electrode contact to which the current is applied to write the reset and set states in the phase-change layer is from about 40 nanometers to about 70 nanometers.

5. The phase-change memory of claim 1, wherein a rising time and a falling time for writing the reset state and/or the set state in the phase-change layer is from about 1 nanosecond to about 4 nanoseconds.

6. The phase-change memory of claim 1, wherein a current for reading the reset state and/or the set state is from about 3 μA to about 6 μA, and a time required for reading the reset state and/or the set state is from about 5 nanoseconds to about 10 nanoseconds.

7. The phase-change memory of claim 2, wherein a current for reading the reset state and/or the set state is from about 3 μA to about 6 μA, and a time required for reading the reset state and/or the set state is from 5 nanoseconds to about 10 nanoseconds.

8. A phase change memory, comprising:
   first and second electrode contacts;
   a phase-change layer between the first and second electrode contacts, the phase change layer providing a first state established by a first number of amorphous nuclei in a crystalline matrix in a region adjacent an interface between the phase-change layer and the first electrode.

9. The phase change memory of claim 8, wherein the phase change layer further provides a second state established by a second number of amorphous nuclei in a crystalline matrix in the region adjacent the interface between the phase-change layer and the first electrode, the second number being greater than the first number.

10. The phase change memory of claim 9, wherein the first number of amorphous nuclei and the second number of amorphous nuclei provide a ratio of resistances of the phase-change layer of from about 1.5 to about 3.

11. The phase change memory of claim 9, wherein the first state of the phase-change layer provides a resistance of the phase-change layer of from about 4 to about 6 kΩ and the second state the phase-change layer provides a resistance of the phase-change layer of from about 6to about 20 kΩ.

12. The phase change memory of claim 9, wherein a current for writing the first state or the second state on the phase-change layer is from about 10 μA to about 200 μA, and a period required for writing the first state or the second state from the phase-change layer is from about 10 nanoseconds to about 100 nanoseconds.

13. The phase change memory of claim 9, wherein a current required for writing the first state in the phase-change layer is from about 30 μA to about 50 μA, and a current required for writing the second state in the phase-change layer is from about 60 μA to about 200 μA.

14. The phase change memory of claim 9, wherein a diameter of the first electrode contact to which a current is applied to write the first and second states in the phase-change layer is from about 40 nanometers to about 70 nanometers.

15. The phase change memory of claim 9, wherein a current for reading the first state and/or the second state is from about 3 μA to about 6 μA, and a time required for reading the first state and/or the second state is from about 5 nanoseconds to about 10 nanoseconds.

16. A method of operating a phase change memory, comprising: establishing logic states in a phase change memory by controlling amorphous nucleation in a crystalline matrix of a phase-changeable material.

17. The method of claim 16, wherein a first logic state is established by a first number of amorphous nuclei in the crystalline matrix and a second logic state is established by a second number of amorphous nuclei in the crystalline matrix, the second number being greater than the first number.

18. The method of claim 17, wherein the first number of amorphous nuclei and the second number of amorphous nuclei provide a ratio of resistances of the phase-changeable material of from about 1.5 to about 3.

19. The method of claim 17, wherein the first logic state provides a resistance of the phase-change layer of from about 4 kΩ to about 6 kΩ and the second logic state provides a resistance of the phase-change layer of from about 6 kΩ to about 20 kΩ.

20. The method of claim 17, wherein controlling amorphous nucleation comprises controlling a current for writing the first logic state or the second logic state to be from about 10 μA to about 200 μA, and a period required for writing the first logic state or the second logic state to be from about 10 nanoseconds to about 100 nanoseconds.

21. The method of claim 17, wherein controlling amorphous nucleation comprises:

controlling a current for writing the first logic state to be from about 30 μA to about 50 μA; and controlling a current or writing the second logic state to be from about 60 μA to about 200 μA.

22. The method of claim 17, wherein a diameter of the first electrode contact to which a current is applied to write the first and second logic states is from about 40 nanometers to about 70 nanometers.

23. The method of claim 17, further comprising controlling a current for reading the first logic state and/or the second logic state to be from about 3 μA to about 6 μA, and a time for reading the first state and/or the second state to be from about 5 nanoseconds to about 10 nanoseconds.

* * * * *